(12) United States Patent
Ma et al.

(10) Patent No.: US 9,558,843 B2
(45) Date of Patent: Jan. 31, 2017

(54) SHIFT REGISTER UNIT, GATE DRIVING CIRCUIT, AND DISPLAY DEVICE COMPRISING THE SAME

(71) Applicants: BOE Technology Group Co., LTD., Beijing (CN); Hefei BOE Optoelectronics Technology Co., LTD., Anhui (CN)

(72) Inventors: Rui Ma, Beijing (CN); Ming Hu, Beijing (CN); Guolei Wang, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 245 days.

(21) Appl. No.: 14/098,158

(22) Filed: Dec. 5, 2013

(65) Prior Publication Data

US 2014/0160000 A1 Jun. 12, 2014

(30) Foreign Application Priority Data

Dec. 7, 2012 (CN) .......................... 2012 1 0523755

(51) Int. Cl.
*G09G 3/36* (2006.01)
*G11C 19/00* (2006.01)
*G11C 19/28* (2006.01)

(52) U.S. Cl.
CPC ............ *G11C 19/28* (2013.01); *G09G 3/3677* (2013.01); *G09G 2310/0286* (2013.01); *G09G 2310/06* (2013.01)

(58) Field of Classification Search
CPC .................. G09G 2310/0286; G09G 2310/06; G09G 3/3677; G11C 19/28
See application file for complete search history.

(56) References Cited

U.S. PATENT DOCUMENTS 6,556,646 B1 * 4/2003 Yeo ...................... G09G 3/3677
377/54
2010/0060561 A1 3/2010 Deane
(Continued)

FOREIGN PATENT DOCUMENTS

| CN | 101639598 A | 2/2010 |
|---|---|---|
| CN | 101727804 A | 6/2010 |

(Continued)

OTHER PUBLICATIONS

First Chinese Office Action for Chinese Patent Application No. 201210523755.0, dated May 4, 2014, 11 pages.

*Primary Examiner* — Kwin Xie
(74) *Attorney, Agent, or Firm* — Westman, Champlin & Koehler, P.A.

(57) ABSTRACT

A shift register unit, a gate driving circuit, and a display device are disclosed. The shift register unit comprising: a pull-up module for pulling up level signal at present-stage signal output based on a signal at a pull-up control node and a first clock input; a control module connected to a first voltage terminal and a second voltage terminal for controlling the level at the pull-up control node based on a signal inputted to a first signal input and a second clock input; and a reset module for resetting the level signal outputted from the present-stage signal output based on a signal inputted to a second signal input. Signal lines and TFTs integrated in the shift register unit may be reduced, thereby saving space occupied by the circuit and reducing product cost.

14 Claims, 4 Drawing Sheets

(56) References Cited

U.S. PATENT DOCUMENTS

2011/0234554 A1* 9/2011 Yoshii et al. ............... 345/204
2012/0163528 A1* 6/2012 Jang et al. ................. 377/64

FOREIGN PATENT DOCUMENTS

| CN | 101882470 A | 11/2010 |
| CN | 202443728 U | 9/2012 |
| JP | 2012-113812 A | 6/2012 |

* cited by examiner

SHIFT REGISTER UNIT, GATE DRIVING CIRCUIT, AND DISPLAY DEVICE COMPRISING THE SAME

CROSS-REFERENCE TO RELATED APPLICATION

This application claims the benefit of Chinese Patent Application No. 201210523755.0 filed on Dec. 7, 2012 in the State Intellectual Property Office of China, the whole disclosure of which is incorporated herein by reference.

BACKGROUND OF THE INVENTION

Field of the Invention

Embodiments of the present invention relate to the technical field of display, and especially to a shift register unit, a gate driving circuit and a display device comprising the same.

Description of the Related Art

A liquid crystal display (LCD) has been broadly used in an electronic device, such as a television, a mobile phone, a display, etc. due to its light weight, thin thickness, and low energy consumption.

The LCD is formed with Pixel arrays arranged transversely and longitudinally. When the LCD is in operation, inputted display data and timing sequence of clock signals can be latched by a date driving circuit, and the inputted display data is converted into analog signal to input to a data line of a liquid crystal panel. The inputted clock signal may be converted into a voltage by a gate driving circuit to control the ON/OFF states of a pixel and applied to gate lines of the liquid crystal panel line by line.

In order to further reduce product cost of a LCD, a Gate Driver on Array (GOA) design is usually adopted in existing gate driving circuits, in which a gate switching circuit based thin film transistor (TFT) is integrated on an array substrate of a display panel to form a scanning drive for the display panel, such that the integrated gate drive circuit can be omitted, the product cost can be reduced in aspects of material and manufacturing process, and the display panel may have symmetrical edges and aesthetically narrowed frames. Meanwhile, the omission of the process of Gate Orientation Bonding can improve productivity and the rate of qualified product. The gate switching circuit integrated in the array substrates by GOA technology is also called as a GOA circuit or a shift register circuit. A large number of signal lines and TFTs are integrated in existing shift register unit, such that the space occupied by the gate switching circuit is increased, thereby increasing the product cost.

SUMMARY OF THE INVENTION

The present invention has been made to overcome or alleviate at least one aspect of the above mentioned disadvantages. Accordingly, the embodiments of the present invention disclose a shift register unit, a gate driving circuit and a display device, which could reduce signal lines and TFTs integrated in the shift register unit, thereby saving the space occupied by the gate driving circuit and reducing the product cost.

According to an aspect of the present invention, there is provided a shift register unit comprising:

a pull-up module configured to output a pulled up high level signal at a present-stage signal output according to signals from a pull-up control node and a first clock input;

a control module connected to a first voltage terminal and a second voltage terminal and configured to control the level at the pull-up control node according to signals from a first signal input and a second clock input; and a reset module configured to reset the high level signal outputted from the present-stage signal output to a low level according to a signal from a second signal input.

According to another aspect of the present invention, there is provided a gate driving circuit comprising a plurality of shift register units described above, wherein:

the present-stage output of each shift register unit except first-stage shift register unit is connected to the second signal input of an adjacent previous-stage shift register unit;

the present-stage output of each shift register unit except last-stage shift register unit is connected to the first signal input of an adjacent next-stage shift register unit.

According to a further aspect of the present invention, there is provided a display device comprising the gate driving circuit described above.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
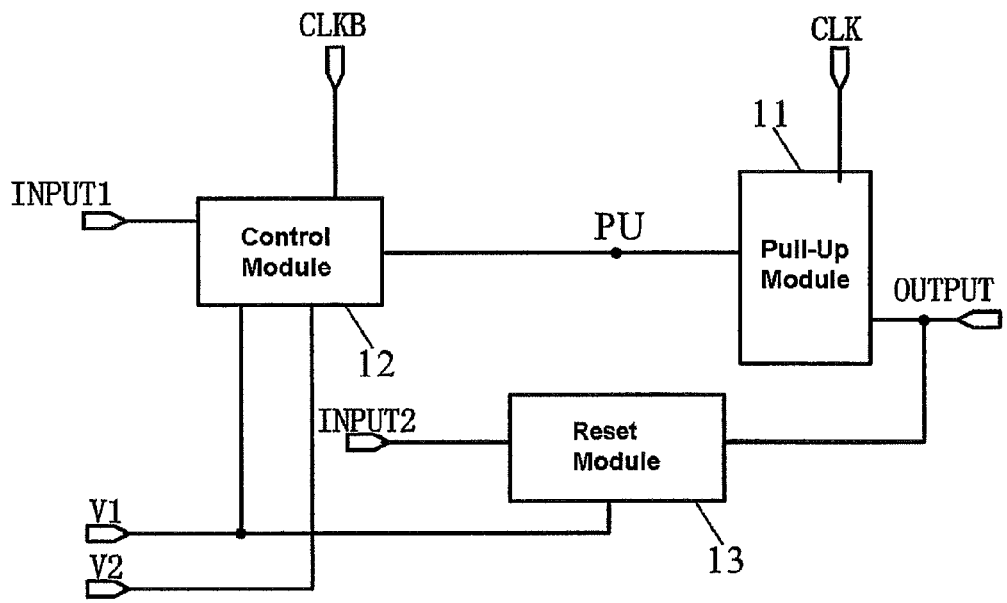
FIG. 1 illustrates a principle block diagram of a shift register unit according to a first exemplary embodiment of the present invention.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

Each transistor mentioned in the embodiments of the present invention may comprise a thin-film transistor (TFT), a field effect transistor, or other component having the same characteristics. The source and the drain of the transistor used herein are symmetrically positioned, such that the source and the drain are non-distinctive. In the embodiments of the present invention, in order to distinguish those two electrodes, one is call the source electrode, and the other is called the drain electrode. Furthermore, the transistors can be divided into N-type transistors and P-type transistors based on their characteristics. All the following embodiments are described based on the N-type transistors. However, it can be appreciated by those skilled in the art that the present invention can be carried out by using the P-type transistors. Therefore, the technical solutions with P-type transistors also fall within the scope of the present invention.

As shown in FIG. 1, the shift register unit according to a first exemplary embodiment of the present invention comprises:

a pull-up module 11 connected to a pull-up control node PU, a first clock input CLK, and a present-stage signal output OUTPUT, and configured to output a pulled-up high level signal at the present-stage signal output OUTPUT according to signals from the pull-up control node PU and the first clock input CLK;

a control module 12 connected to a first signal input INPUT1, a second signal input INPUT2, a first voltage terminal V1, a second voltage terminal V2, and the pull-up control node PU, and configured to control the level at the pull-up control node PU according to signals inputted from the first signal input INPUT1 and a second clock input CLKB; and a reset module 13 connected to the second signal input INPUT2 and the first voltage terminal V1, and configured to reset the signal outputted from the present-stage signal output OUTPUT to low level according to a signal inputted from the second signal input INPUT2.

The shift register unit according to the embodiment of the present invention could reduce the signal lines and TFTs integrated therein, thereby reducing the space occupied by the circuit and the product cost.

In the shift register unit described above, the first voltage terminal V1 may be grounded, or inputted with a low level VSS. In the embodiment of the present invention, the shift register unit will be described with the low level VSS inputted to the first voltage terminal V1.

Figure 2:
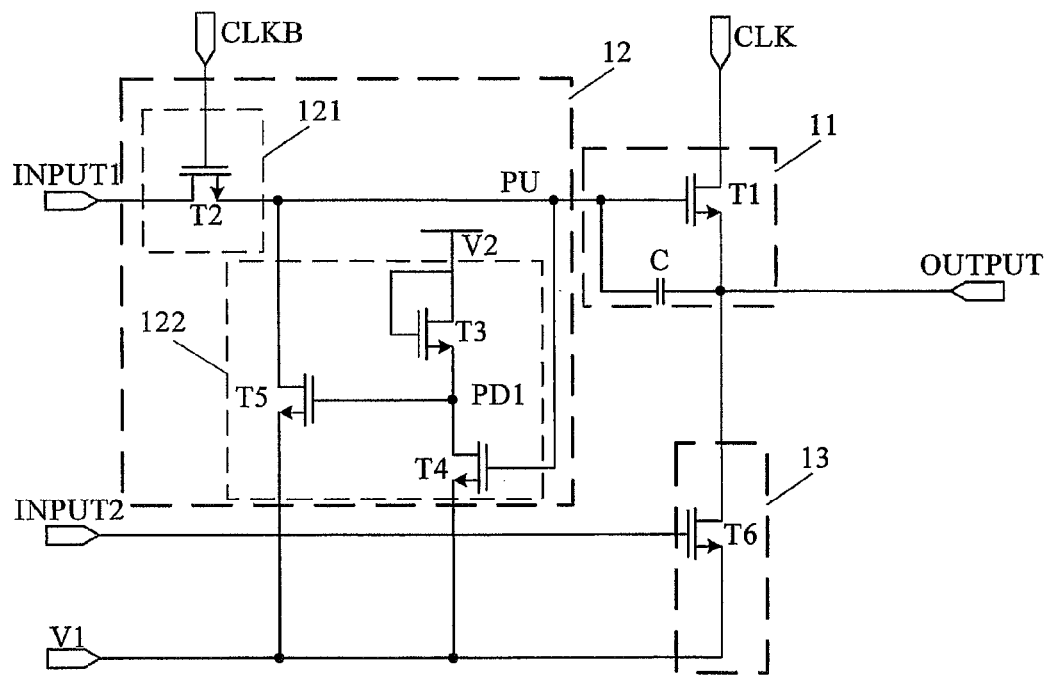
FIG. 2 illustrates a circuit structure according to an exemplary embodiment of the shift register unit shown in FIG. 1.

Furthermore, as shown in FIG. 2, in the shift register unit according to an exemplary embodiment of the present invention, the pull-up module 11 may comprises: a first transistor T1, of which the source is connected to the present-stage signal output OUTPUT, the gate is connected to the pull-up control node PU, and the drain is connected to the first clock input CLK; and a capacitor C connected between the source and the gate of the first transistor T1.

In the embodiment of the present invention, the pull-up module 11 is used to output high level signal at the present-stage signal output OUTPUT in a half of a clock cycle when the first clock input CLK is at high level after the pull-up module 11 is pre-charged.

As shown in FIG. 2, the control module 12 may comprise: a first control sub-module 121 connected to the first signal input INPUT1 and the second clock input CLKB and configured to pull up the pull-up control node PU to high level based on the signals inputted to the first signal input INPUT1 and the second clock input CLKB; and a second control sub-module 122 connected to the first voltage terminal V1, the second voltage terminal V2, and the pull-up control node PU and configured to maintain the pull-up control node PU at low level based on a feedback signal of the pull-up control node PU.

Please note that, in the embodiment of the present invention, the pull-up control node PU is connected to the gate of the first transistor T1, and the ON/OFF states of the first transistor T1 may be controlled by varying the level at the pull-up control node PU.

Furthermore, as shown in FIG. 2, the first control sub-module 121 may comprise: a second transistor T2, of which the source is connected to the pull-up control node PU, the gate is connected to the second clock input CLKB, and the drain is connected to the first signal input INPUT1.

The second control sub-module 122 may comprise: a third transistor T3, of which the source is connected to a first pull-down control node PD1, the gate and the drain both are connected to the second voltage terminal V2; a fourth transistor T4, of which the drain is connected to the first pull-down control node PD1, the gate is connected to the pull-up control node PU, and the source is connected to the first voltage terminal V1; a fifth transistor T5, of which the source is connected to the first voltage terminal V1, the gate is connected to the first pull-down control node PD1, and the drain is connected to the pull-up control node PU.

Please note that, in the embodiment of the present invention, the first pull-down control node PD1 is connected to the gate of the fifth transistor T5, and the ON/OFF state of the fifth transistor T5 may be controlled by varying the level at the first pull-down control node PD1. The second voltage terminal V2 may comprise a high level input VDD.

In such configured control module 12, the level at the pull-up control node PU may be controlled based on the signal inputted to the first signal input INPUT1 and the second clock input CLKB.

Specifically, the signal G(N−1) from a previous-stage shift register unit may be inputted to the first signal input INPUT1. When the signal G(N−1) and the signal of the second clock input CLKB are both in high level, the second transistor T2 is turned on, the pull-up control node PU is at high level, and the first transistor T1 is turned on. If the first clock input CLK is at low level, the source of the first transistor T1 is at low level, such that the capacitor C is pre-charged by the signal G(N−1) from the previous-stage shift register unit. When the signal G(N−1) outputted from the previous-stage shift register unit and the signal of the second clock input CLKB are both low level signals, the second transistor T2 is turned off, the pull-up control node PU is still maintained at high level due to the charged capacitor C, and if the first clock input CLK is at high level, then the present-stage signal output OUTPUT may output a high level gate driving signal steadily. When the signal G(N−1) outputted from the previous-stage is a low level signal while the signal of the second clock input CLKB is a high level signal, the second transistor T2 is turned on, the pull-up control node PU is at low level, the fourth transistor T4 is turned off, the level at the first pull-down control node PD1 is pulled up by the third transistor T3, such that the fifth transistor T5 is turned on, the pull-up control node PU is held at low level, and the stability of the signal outputted form the present-stage signal output OUTPUT is ensured.

Further, as shown in FIG. 2, the reset module 13 may comprise: a sixth transistor T6, of which the source is connected to the first voltage terminal V1, the gate is connected to the second signal input INPUT2, and the drain is connected to the present-stage signal output OUTPUT.

Specifically, the signal G(N+1) outputted from a next-stage shift register unit may be inputted to the second signal input INPUT2. When the signal G(N+1) is a high level signal, the sixth transistor T6 is turned on, such that the present-stage signal output OUTPUT is maintained at low level, thereby further improving the stability of the gate driving circuit.

In the prior art, the pull-up unit usually comprises a transistor and a capacitor. However, the size of the transistor is usually large; therefore a large parasitic capacitance exists. Before a high level is applied to the signal input of the shift register unit, when the clock input CLK is at high level, the voltage at the gate of the transistor should be at low level in theory. However, the voltage at the gate is pulled up by the parasitic capacitance of the transistor, such that a noise voltage is generated, and a relative small noise voltage is also generated at the output end of the shift register due to the coupling effect of the capacitor, and thus a bad display is resulted.

Figure 3:
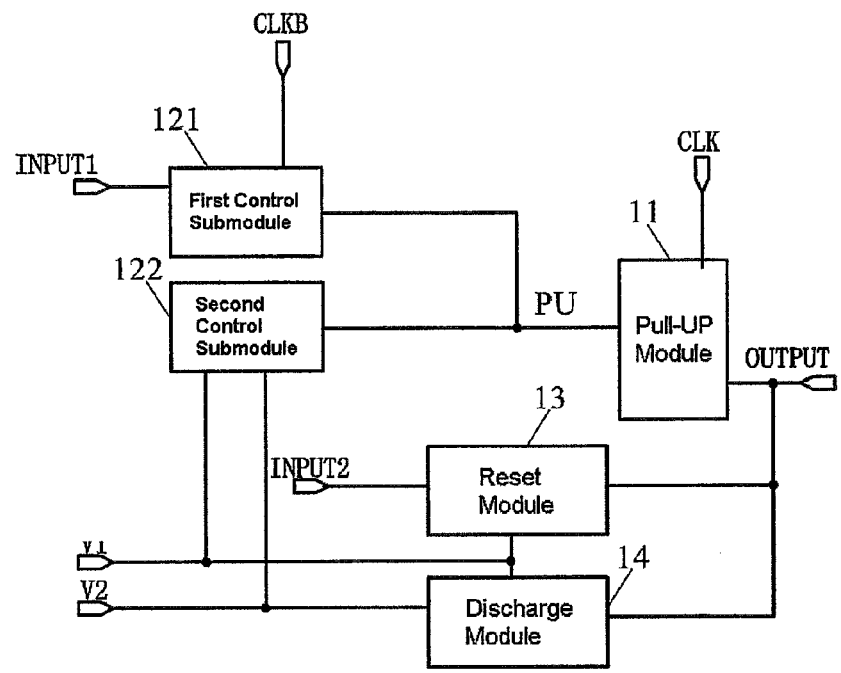
FIG. 3 illustrates a principle block diagram of a shift register unit according to a second exemplary embodiment of the present invention.

To further eliminate the noise voltage generated at the output end of the shift register unit, as shown in FIG. 3, the shift register unit according to a second exemplary embodiment of the present invention further comprises a discharge module 14 based on the configuration of the shift register unit of FIG. 1. Furthermore, the discharge module 14 is connected to the first voltage terminal V1, the second voltage terminal V2, and the present-stage signal output OUTPUT, and configured to control the pull-up module 11 to discharge based on the signal outputted from the present-stage signal output OUTPUT.

Figure 4:
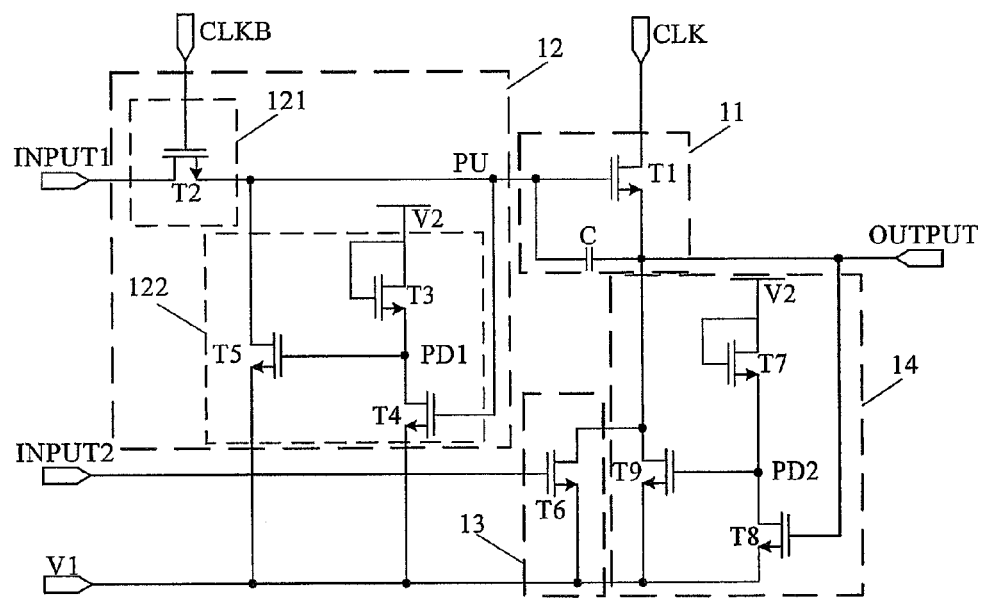
FIG. 4 illustrates a circuit structure according to an exemplary embodiment of the shift register unit shown in FIG. 3.

Further, as shown in FIG. 4, the discharge module 14 may comprise:

a seventh transistor T7, of which the source is connected to a second pull-down control node PD2, the gate and the drain are both connected to the second voltage terminal V2;

an eighth transistor T8, of which the source is connected to the first voltage terminal V1, the gate is connected to the present-stage signal output OUTPUT, and the drain is connected to the second pull-down control node PD2; and a ninth transistor T9, of which the source is connected to the first voltage terminal V1, the gate is connected to the second pull-down control node PD2, and the drain is connected to the present-stage signal output OUTPUT.

Please note that, the second pull-down control node PD2 is connected to the gate of the ninth transistor T9, such that the ON/OFF state of the ninth transistor T9 may be controlled with the level at the second pull-down control node PD2.

By using such a discharge module 14 and sizing the transistors T7, T8, and T9, when a low level is outputted from the present-stage signal output OUTPUT, the transistor T7 is turned on, the transistor T8 is turned off, such that the second pull-down control node PD2 is at high level to turn on the transistor T9, the signal outputted from the present-stage signal output OUTPUT is ensured pulled down and held at a low level, such that the interference due to the noise voltage can be avoided. That is, when the present-stage signal output OUTPUT should be at desired low level, even if a noise voltage is generated at the present-stage signal output OUTPUT, the noise voltage is ensured pulled down since the transistor T8 is turned off. The transistor T8 is turned off because the noise voltage is usually low and cannot turn on the transistor T8. The transistor T9 is turned on by the high level at the second pull-down control node PD2 since the transistor T7 is turned off.

In one hand, the shift register unit provided in the embodiment of the present invention may reduce signal lines and TFTs integrated therein, thereby saving the space occupied by the circuit and reducing the product cost. In the other hand, the noise voltage generated at the output end due to a coupling capacitor generated in the pull-up module may be efficiently eliminated by turning on the transistors T5 and T9.

Figure 5:
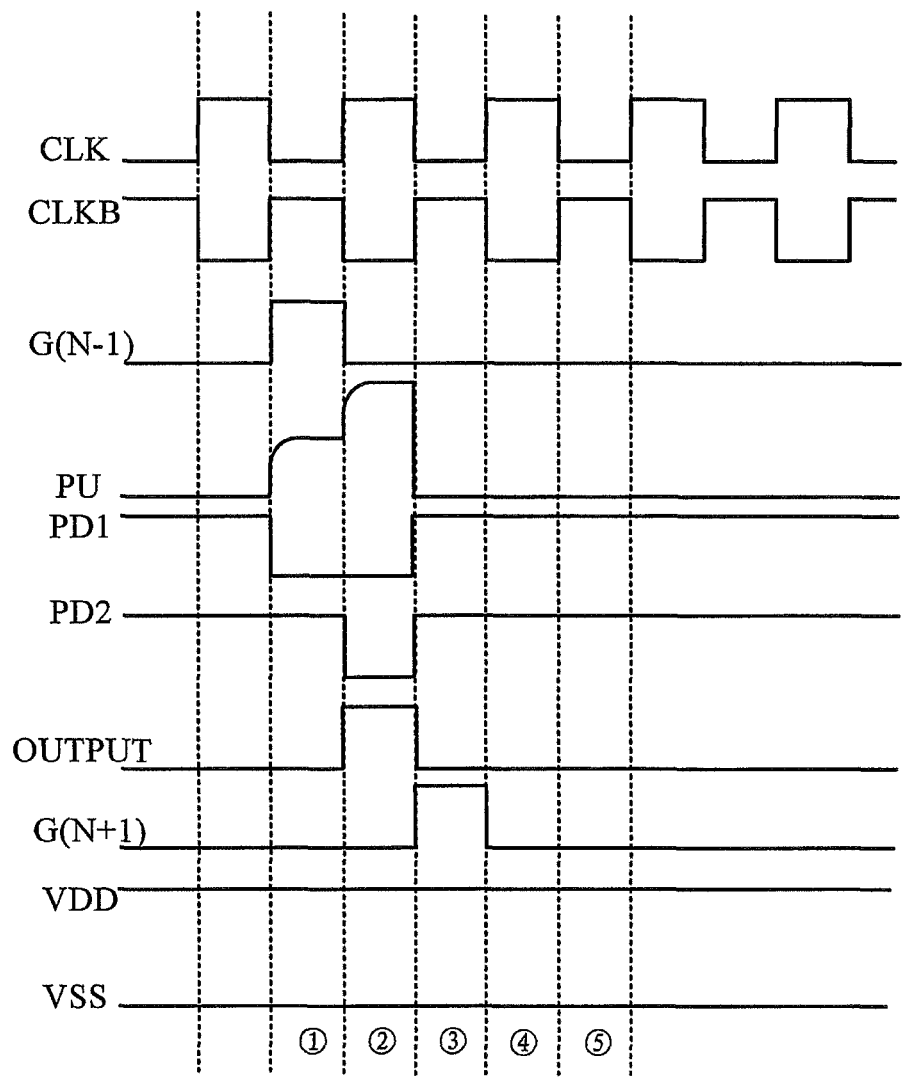
FIG. 5 illustrates a signal sequence diagram of a shift register unit according to the embodiments of the present invention.

As shown in FIG. 4, a shift register unit comprises nine N-type transistors. The signal sequence during the operation of such shift register unit is shown, for example, in FIG. 5. The signal G(N−1) outputted from the previous-stage shift register unit is inputted to the first signal input INPUT1 of the present-stage shift register unit, and the signal G(N+1) outputted from the next-stage shift register unit is inputted to the second signal input INPUT2 of the present-stage shift register unit. The first clock input CKL and the second clock input CKLB have the same cycle, but with opposite phases. The operating principle of the shift register unit according to the second embodiment of the present invention will be described in detail as follows.

In the first phase①, the signal G(N−1) outputted from the previous-stage shift register unit is inputted to the first signal input INPUT1 of the present-stage shift register unit, the first signal input INPUT1 and the first clock input CLK are at high level, such that the second transistor T2 is turned on. When the first clock input CLK is at low level, the capacitor C is charged by the high level signal from the first signal input INPUT1, such that the level of the pull-up control node PU is pulled up and the fourth transistor T4 is turned on at the same time. The transistors T3 and T4 are sized, such that the first pull-down control node PD1 is at low level at this time, the transistor T5 is turned off, and the present-stage output OUTPUT is at low level. The transistors T7 and T8 are sized, such that the second pull-down control node PD2 is at high level, the present-stage output OUTPUT is maintained at low level, thereby the stability of the signal outputted from the present-stage output OUTPUT is ensured.

In a second phase②, the signal inputted to the first signal input INPUT1 and the second clock input CLKB are both at low level, the second transistor T2 is turned off, the pull-up control node PU is still maintained at high level, the transistor T1 is kept turned on, the first pull-down control node PD1 is still maintained at low level as in the first phase①, and the transistor T5 is kept turned off. At this time, the present-stage output OUTPUT is at high level, such that the transistor T8 is turned on. The transistors T7 and T8 are sized, such that the node second pull-down control PD2 is at low level, and the transistor T9 is turned off, thereby a stable high level signal is outputted from the present-stage output OUTPUT. At this time, the first clock input CLK is at high level, the voltage at the pull-up control node PU is amplified due to the bootstrapping effect, and finally, a high level driving signal is outputted from the present-stage output OUTPUT.

In a third phase③, the signal G(N+1) outputted from the next-stage shift register unit is inputted to the second signal input INPUT2 of the present-stage shift register unit as a high level reset signal, and the first clock input CLK is at low level. The transistor T6 is turned on by the high level signal from the second input INPUT2, such that the present-stage output OUTPUT transmit a low level turn off signal; the transistor T8 is turned off, the transistors T7 and T8 are sized, such that the node second pull-down control PD2 is at high level, and the transistor T9 is turned on, so that the capacitor C is discharged through the present-stage output OUTPUT. At the same time, the second clock input CLKB is at high level, the first input INPUT1 of the present-stage shift register unit is at low level, the voltage at the pull-up control node PU is lowered to low level, and the transistor T4 is turned off. At this time, the first pull-down control node PD1 is at high level, the transistor T5 is turned on, such that the level at the pull-up control node PU is pulled down and the pull-up control node PU is maintained at low level.

In a fourth phase④, the first clock input CLK is at high level. As the pull-up control node PU is at low level as at the third phase, the transistor T1 is turned off, the first clock input CLK, which is at high level, will not be transmitted to the present-stage output OUTPUT. The signal outputted from the present-stage output OUTPUT is kept at the low level as in the third phase and is kept outputted. At the same time, the pull-up control node PU is at low level, the first pull-down control node PD1 and the second pull-down control node PD2 both are held at high level, so that the transistor T5 and T9 are turned on, the capacitor C is discharged, such that the noise voltage generated by the first clock input CLK is eliminated. Therefore, the present-stage output OUTPUT is held to output low level, and the stability of the low level output is ensured.

In a fifth phase⑤, the first clock input CLK is at low level, the first pull-down control node PD1 and the second pull-down control node PD2 are still maintained at high level, the transistors T5 and T9 is kept turned on, such that both electrodes of the capacitor C is maintained at low level. Therefore, the impact of the noise voltage on the present-stage output OUTPUT is minimized, and the stability of the output from the present-stage output OUTPUT of the shift register is ensured.

Thereafter, the fourth phase and the fifth phase alternately repeat until the first phase restarts.

Figure 6:
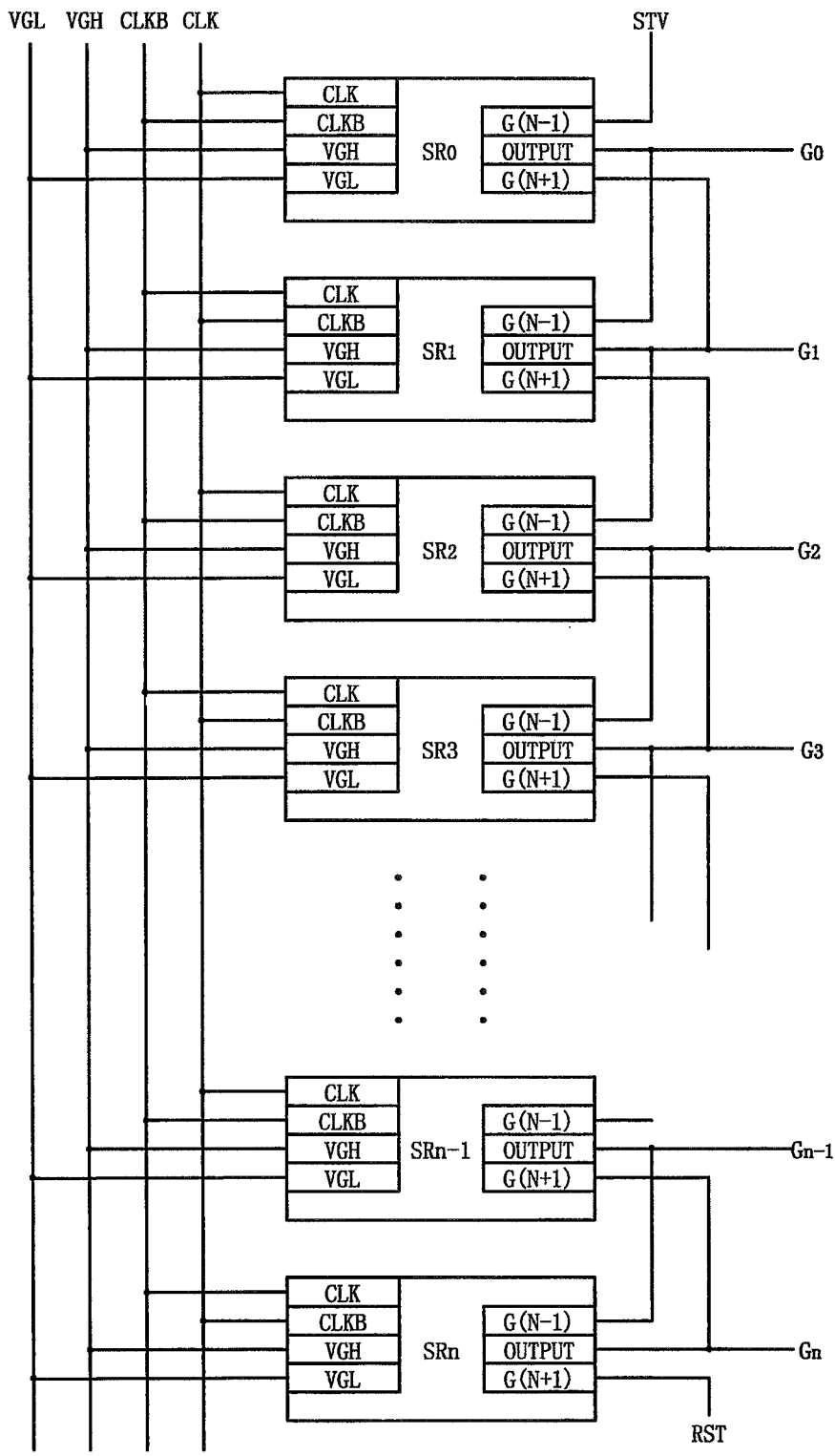
FIG. 6 illustrates a principle diagram of a gate drive circuit according to an exemplary embodiment of the present invention.

The gate driving circuit in the embodiment of the present invention, as shown in FIG. 6, comprises a plurality of shift register units described in the above embodiments, wherein, the present-stage output OUTPUT of each shift register unit SR is configured to output present-stage line-scanning signal G; each shift register unit comprises an input end used as the first clock input CLK and a input end used as the second clock input CLKB; the phase difference between the first clock input CLK and the second clock input CLKB is 180 degrees, and the first clock input CLK and the second clock input CLKB output high level in one half of their time cycle and output low level in the other half of their time cycle respectively. Further, there is a phase difference of 180 degrees exists between the first clock inputs CLK for two adjacent shift register units, and between the second clock inputs CLKB for the two adjacent shift register units.

Wherein, the VGH may comprise the VDD which is at high level, and the VGL may comprise the VSS which is at low level.

The present-stage output OUTPUT of each shift register unit except a first-stage shift register unit SR0 is connected to the second signal input INPUT2 of an adjacent previous-stage shift register unit for receiving the signal G(N+1);

The present-stage output OUTPUT of each shift register unit except a last-stage shift register unit SRn is connected to the first signal input INPUT1 of an adjacent next-stage shift register unit for receiving the signal G(N-1).

In the embodiment of the present invention, a frame start signal STV may be inputted to the first signal input INPUT1 of the first-stage shift register unit SR0, a reset signal RST may be inputted to the second signal input INPUT2 of the last-stage shift register unit SRn, or the signal Gn outputted from the present-stage output OUTPUT of the last-stage shift register unit SRn may be used as the present-stage reset signal RST.

With the gate driving circuit according to the embodiment of the present invention, signal lines and TFTs integrated in the shift register unit may be reduced, thereby saving space occupied by the circuit and reducing product cost.

Also disclosed in the embodiment of the present invention is a display device, which comprises the gate driving circuit according to various embodiments of the present invention.

With the display device comprising the gate driving circuit according to the embodiments of the present invention, signal lines and TFTs integrated in the shift register unit may be reduced, space occupied by the circuit is reduced, and thereby product cost is reduced.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A shift register unit, comprising:
  a pull-up module configured to output a pulled up high level signal at a present-stage signal output according to signals from a pull-up control node and a first clock input;
  a control module connected to a first voltage terminal and a second voltage terminal and configured to control the level at the pull-up control node according to signals from a first signal input and a second clock input; and
  a reset module configured to reset the high level signal outputted from the present-stage signal output to a low level signal according to a signal from a second signal input,
  wherein the pull-up module comprises:
    a first transistor, of which the source is connected to the present-stage signal output, the gate is connected to the pull-up control node, and the drain is connected to the first clock input; and
    a capacitor connected between the source and the drain of the first transistor,
  wherein the control module comprises a first control sub-module and a second control sub-module, and
  wherein when the signal from the first signal input and the signal from the second clock input are both at high level, the pull-up control node is pulled up to high level; when the pull-up control node is at high level and the signal from the first clock input is at low level, the capacitor is pre-charged, so that when the signal from the first signal input and the signal from the second clock input are both in low level, the pull-up control node is maintained at high level by the second control sub-module according to the feedback signal, which is at high level, from the pull-up control node; and when the signal from the first signal input is at low level while the signal of the second clock input is a high level signal, the pull-up control node is switched to low level, and the pull-up control node is held at low level by the second control sub-module according to the feedback signal , which is at low level, from the pull-up control node.

2. The shift register unit according to claim 1, wherein the first control sub-module comprises:
  a second transistor, of which the source is connected to a first pull-down control node, the gate is connected to the second clock input, and the drain is connected to the first signal input; and
the second control sub-module comprises:
  a third transistor, of which the source is connected to the first pull-down control node, the gate and the drain both are connected to the second voltage terminal;
  a fourth transistor, of which the drain is connected to the first pull-down control node, the gate is connected to the pull-up control node, and the source is connected to the first voltage terminal; and
  a fifth transistor, of which the source is connected to the first voltage terminal, the gate is connected to the first pull-down control node, and the drain is connected to the pull-up control node.

3. The shift register unit according to claim 1, wherein the reset module comprises:
a sixth transistor, of which the source is connected to the first voltage terminal, the gate is connected to the second signal input, and the drain is connected to the present-stage signal output.

4. The shift register unit according to claim 1, further comprising:
a discharge module configured to control the pull-up module to discharge based on the signal outputted from the present-stage signal output.

5. The shift register unit according to claim 4, wherein the discharge module comprises:
a seventh transistor, of which the source is connected to a second pull-down control node, the gate and the drain are connected to the second voltage terminal;
an eighth transistor, of which the source is connected to the first voltage terminal, the gate is connected to the present-stage signal output, and the drain is connected to the second pull-down control node; and
a ninth transistor, of which the source is connected to the first voltage terminal, the gate is connected to the second pull-down control node, and the drain is connected to the present-stage signal output.

6. A gate driving circuit, comprising a plurality of shift register units according to claim 1, wherein
the present-stage output of each shift register unit except first-stage shift register unit is connected to the second signal input of an adjacent previous-stage shift register unit;
the present-stage output of each shift register unit except last-stage shift register unit is connected to the first signal input of an adjacent next-stage shift register unit.

7. The gate driving circuit according to claim 6, wherein the first control sub-module comprises:
a second transistor, of which the source is connected to a first pull-down control node, the gate is connected to the second clock input, and the drain is connected to the first signal input; and
the second control sub-module comprises:
a third transistor, of which the source is connected to the first pull-down control node, the gate and the drain both are connected to the second voltage terminal;
a fourth transistor, of which the drain is connected to the first pull-down control node, the gate is connected to the pull-up control node, and the source is connected to the first voltage terminal; and
a fifth transistor, of which the source is connected to the first voltage terminal, the gate is connected to the first pull-down control node, and the drain is connected to the pull-up control node.

8. The gate driving circuit according to claim 6, wherein the reset module comprises:
a sixth transistor, of which the source is connected to the first voltage terminal, the gate is connected to the second signal input, and the drain is connected to the present-stage signal output.

9. The gate driving circuit according to claim 6, further comprising:
a discharge module configured to control the pull-up module to discharge based on the signal outputted from the present-stage signal output.

10. The gate driving circuit according to claim 9, wherein the discharge module comprises:
a seventh transistor, of which the source is connected to a second pull-down control node, the gate and the drain are connected to the second voltage terminal;
an eighth transistor, of which the source is connected to the first voltage terminal, the gate is connected to the present-stage signal output, and the drain is connected to the second pull-down control node; and
a ninth transistor, of which the source is connected to the first voltage terminal, the gate is connected to the second pull-down control node, and the drain is connected to the present-stage signal output.

11. The gate driving circuit according to claim 6, wherein a frame start signal is inputted to the first signal input of the first-stage shift register unit, and a reset signal is inputted to the second signal input of the last-stage shift register unit.

12. A display device, comprising the gate driving circuit according to claim 6.

13. The display device according to claim 12, further comprising:
a discharge module configured to control the pull-up module to discharge according to the signal outputted from the present-stage signal output.

14. The display device according to claim 12, wherein a frame start signal is inputted to the first signal input of the first-stage shift register unit, and a reset signal is inputted to the second signal input of the last-stage shift register unit.

* * * * *